(12) United States Patent
Chen et al.

(10) Patent No.: US 7,301,386 B2
(45) Date of Patent: Nov. 27, 2007

(54) APPARATUS FOR IMPROVED DELAY VOLTAGE LEVEL SHIFTING FOR LARGE VOLTAGE DIFFERENTIALS

(75) Inventors: David J. Chen, Endwell, NY (US); Michael K. Kerr, Johnson City, NY (US); William F. Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 11/278,236

(22) Filed: Mar. 31, 2006

(65) Prior Publication Data

US 2007/0229138 A1    Oct. 4, 2007

(51) Int. Cl.
*H03L 5/00* (2006.01)

(52) U.S. Cl. .................. 327/333; 327/319; 327/67; 326/62

(58) Field of Classification Search ............. 327/333, 327/315, 318, 319, 52, 54, 65, 67; 326/62, 326/63, 80
See application file for complete search history.

(56) References Cited

U.S. PATENT DOCUMENTS

| | | | |
|---|---|---|---|
| 6,011,421 A * | 1/2000 | Jung | 327/333 |
| 6,429,683 B1 | 8/2002 | Miller et al. | |
| 6,489,828 B1 | 12/2002 | Wang et al. | |
| 6,556,061 B1 | 4/2003 | Chen et al. | |
| 6,566,930 B1 * | 5/2003 | Sato | 327/333 |
| 6,642,769 B1 * | 11/2003 | Chang et al. | 327/333 |
| 6,664,809 B1 | 12/2003 | Chiu | |
| 6,774,696 B2 * | 8/2004 | Clark et al. | 327/333 |
| 6,788,125 B1 | 9/2004 | Tomsio | |
| 6,812,768 B2 * | 11/2004 | Kawasaki et al. | 327/333 |
| 6,888,394 B2 * | 5/2005 | Cleary et al. | 327/333 |
| 7,046,067 B2 * | 5/2006 | Chung | 327/333 |
| 7,068,091 B1 * | 6/2006 | Kwong | 327/333 |

* cited by examiner

*Primary Examiner*—Kenneth B. Wells
*Assistant Examiner*—Hai L Nguyen
(74) *Attorney, Agent, or Firm*—Cantor Colburn LLP

(57) ABSTRACT

A voltage level shifting device for translating a lower operating voltage to a higher operating voltage includes a first input node coupled to a first pull down device and a second input node coupled to a second pull down device. The second node receives a complementary logic signal with respect to the first input node, the first and second input nodes associated with the lower operating voltage. A first pull up device is in series with the first pull down device and second pull up device is in series with the second pull down device, with the first and second pull up devices coupled to a power supply at the higher operating voltage. An output node is between the second pull down device and the second pull up device, the output node controlling the conductivity of the first pull up device. A clamping device is in parallel with the first pull up device, and configured to prevent the second pull up device from becoming fully saturated.

8 Claims, 2 Drawing Sheets

APPARATUS FOR IMPROVED DELAY VOLTAGE LEVEL SHIFTING FOR LARGE VOLTAGE DIFFERENTIALS

BACKGROUND

The present invention relates generally to digital integrated circuits and, more particularly, to an apparatus for improved delay voltage level shifting for large voltage differentials.

Over the last several years, CMOS-based (complementary metal-oxide semiconductor) integrated circuit (IC) technologies have been designed to operate with progressively lower power supply voltages with each passing generation. Lower supply voltages dictate lower voltage swings for the associated digital signals, which typically switch between ground and the power supply voltage. The benefits of using lower supply voltages include lower power consumption and faster signal switching times. On the other hand, lower supply voltages also result in lower noise margins. CMOS logic IC power supply voltages currently available include, for example, 3.3 V, 2.5 V, 1.8 V, 1.5 V and 1.0 V. Depending on the application, a mix of the various CMOS technologies may be used in any particular electronic product, thus necessitating the use of digital voltage level shifters to translate CMOS signals generated using one power supply voltage to signals based on a different voltage level.

FIG. 1 is a schematic diagram of an existing CMOS voltage level shifter 100 used to translate lower voltage signals (e.g., 1.0 V) to higher voltage signals (e.g., 3.3 V). As is shown, the level shifter includes four FETs, NFETs T1 and T2, as well as PFETs T3 and T4. The FETs of level shifter 100 are typically thick oxide devices, as the thin oxide devices used for 1.0 V signals cannot operate at the higher 3.3 V operating voltage. The input signals A and ABAR represent lower voltage signals and drive the gates of NFETs T1 and T2, respectively. Signal ABAR is the logical complement (NOT) of signal A. As also illustrated, the source terminals of NFET T1 and NFET T2 are connected to ground, while the source terminals of PFET T3 and PFET T4 are connected to the higher voltage supply (e.g., 3.3 V). The gate terminals of T3 and T4 are cross-coupled to the respective drain terminals thereof. The drain terminal of T3 is further connected to the drain terminal of T1, while the drain terminal of T4 is connected to the drain terminal of T2. The output signal Z represents the voltage level shifted value of input signal A.

For example, if A is logical 1 at the lower operating voltage (e.g., 1.0 V) and ABAR is logical 0 (ground), then Z is logical 1 at the shifted, higher operating voltage (e.g., 3.3 V). In this case, the 1.0 V input at A renders NFET T1 conductive, while the 0 V input at ABAR leaves NFET T2 off. As a result, the gate voltage of PFET T4 is pulled to ground, rendering it conductive. Accordingly the gate of T3 (and therefore output Z) is pulled up to the higher operating voltage, which also leaves PFET T3 non-conducting. Conversely, if A is at 0 V and ABAR is at 1.0 V, then NFET T1 is switched off while NFET T2 is switched on. The gate of PFET T3 is pulled toward ground, thereby switching it on, which in turn causes the gate voltage of PFET T4 to rise and thus switch it off. Conductive NFET N2 can then pull the output voltage at Z all the way to ground, unopposed by T4. When operating properly, CMOS level shifter 100 does not draw DC current.

However, the conventional level shifter 100 of FIG. 1 typically requires large NFET to PFET ratios for proper operation, which is unlike most CMOS circuits that usually require the PFET device to be larger than the NFETs to achieve a balanced output rise and fall delay. When translating low voltage CMOS signals typical in CMOS technologies of gate lengths below 0.18 μm to higher voltage signals, the NFET to PFET size ratio required by the circuit in FIG. 1 can be as large as 60:1 or sometimes as large 100:1. Such ratios are required in order to achieve proper operation over process variations, voltage variations, and temperature variations (PVT). More specifically, the large NFET versus PFET ratio is required because the low voltage signals driving the gates of NFETs T1 and T2 are very close to the $V_t$ (threshold voltage) of these devices and therefore are not able to turn T1 and T2 on strongly. The gates of PFETs T3 and T4, on the other hand, are driven by the higher voltage signal (e.g., 3.3 V). Thus, when these devices are turned on, they are strongly turned on. As a result, PFETs T3 and T4 must be very small relative to NFETs T1 and T2 so as to balance the current drive capability of the PFETs versus the NFETs.

The requirement for this level shifting circuit to operate over large process, voltage, and temperature ranges further pushes the NFET to PFET ratio even larger for conditions where the low voltage is at its lower tolerance value, the high voltage is at its higher tolerance value, and where the chip manufacturing process has resulted in strong PFETs and weak NFETs. Because NFETs T1 and T2 are so large, the A and ABAR inputs must drive a large gate capacitance. These high ratios can also make PFET T4 very weak relative with respect to NFET T2 for many PVT conditions, such as when the manufacturing process has created weak PFETs and strong NFETs and when the lower voltage supply is at its higher tolerance value. Under these conditions, the circuit of FIG. 1 has both a large output rise delay and a large output rise delay to output fall delay mismatch. Even under nominal PVT conditions, the large gate input capacitance and weak PFET create a slow circuit and large rise/fall delay mismatches, both of which are undesirable.

Accordingly, there is a need for an improved CMOS level shifting device which overcomes the above described disadvantages and allows for smaller NFET devices, improved rise/fall delays and improved rise/fall delay mismatch characteristics, and which operates correctly over extreme PVT variations.

SUMMARY

The foregoing discussed drawbacks and deficiencies of the prior art are overcome or alleviated by a voltage level shifting device for translating a lower operating voltage to a higher operating voltage. In an exemplary embodiment, the level shifter includes a first input node coupled to a first pull down device and a second input node coupled to a second pull down device. The second node receives a complementary logic signal with respect to the first input node, the first and second input nodes associated with the lower operating voltage. A first pull up device is in series with the first pull down device and second pull up device is in series with the second pull down device, with the first and second pull up devices coupled to a power supply at the higher operating voltage. An output node is between the second pull down device and the second pull up device, the output node controlling the conductivity of the first pull up device. A clamping device is in parallel with the first pull up device, and configured to prevent the second pull up device from becoming fully saturated.

In another embodiment, a CMOS level shifter for translating a lower operating voltage to a higher operating voltage includes a first input node coupled to a first pull down NFET and a second input node coupled to a second pull down NFET. The second node receives a complementary logic signal with respect to the first input node, the first and second input nodes associated with the lower operating voltage. A first pull up PFET is in series with the first pull down NFET and a second pull up PFET is in series with the second pull down NFET, the first and second pull up PFETs coupled to a power supply at the higher operating voltage. An output node is between the second pull down NFET and the second pull up PFET, the output node controlling the conductivity of the first pull up PFET. A clamping device is in parallel with said first pull up PFET, the clamping device configured to prevent the second pull up PFET from becoming fully saturated.

BRIEF DESCRIPTION OF THE DRAWINGS

Referring to the exemplary drawings wherein like elements are numbered alike in the several Figures.

DETAILED DESCRIPTION

In the following description, exemplary values of 1.0 V and 3.3 V are used in conjunction with the terms "lower voltage" and "higher voltage", respectively. However, it should be understood that the embodiments described herein are not limited to these specific voltages; one skilled in the art of circuit design will recognize that different values of voltages can be substituted for 1.0 V and 3.3 V, wherein the lower voltage is lower than or equal to the higher voltage. In other words, the present disclosure is applicable for shifting between any two desired operating voltage levels.

Figure 1:
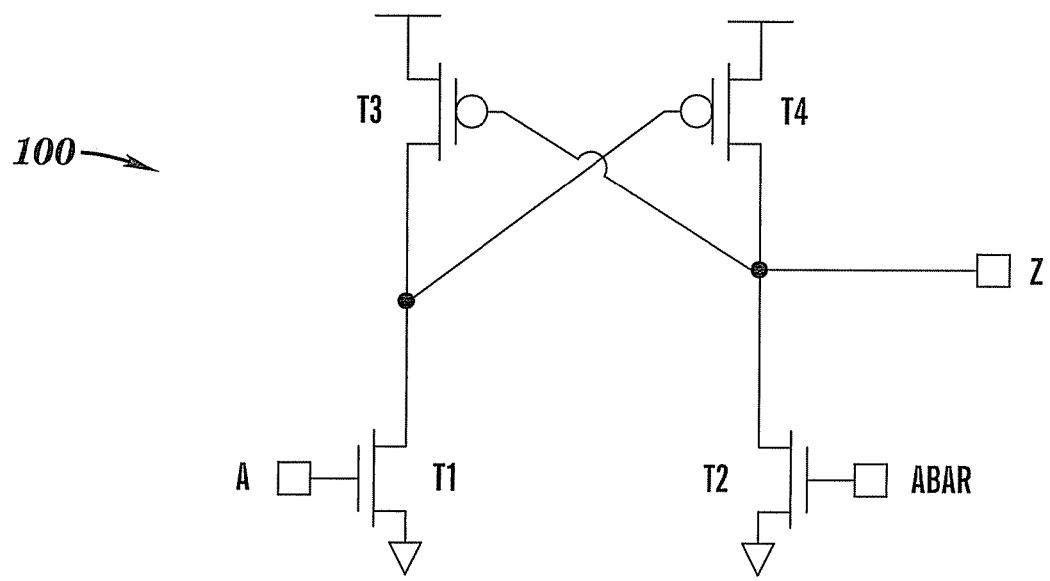
FIG. 1 is a schematic diagram of a conventional CMOS level shifter used to translate lower voltage signals to higher voltage signals.
Figure 2:
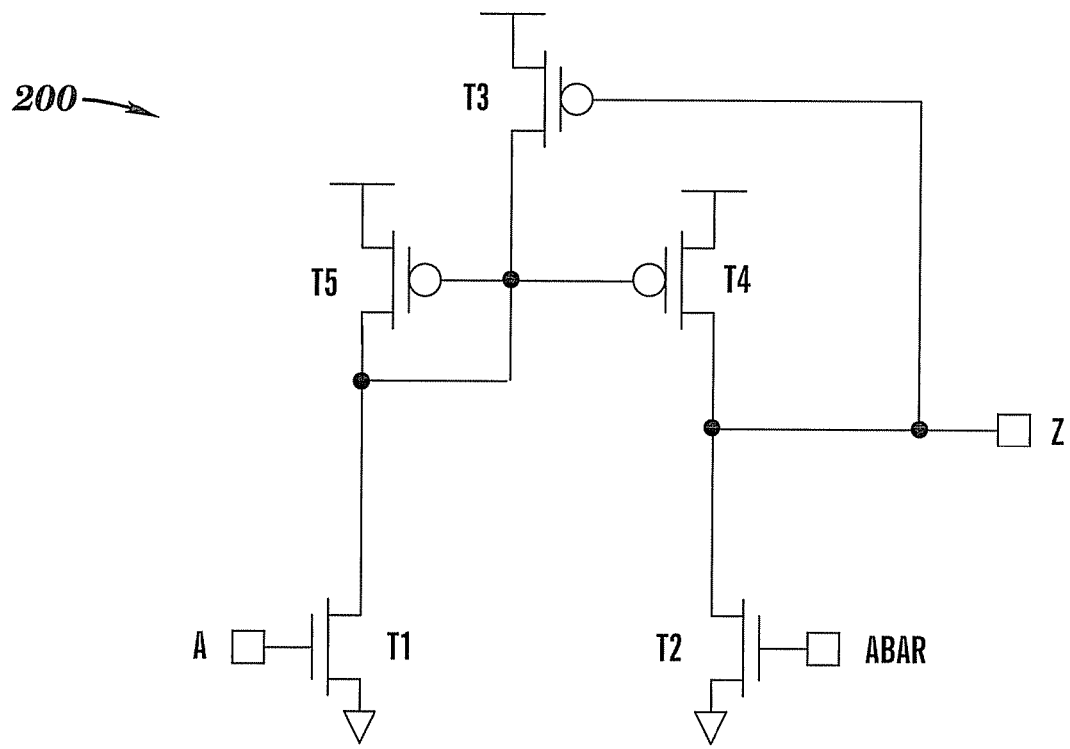
FIG. 2 is a schematic diagram of a CMOS level shifter, in accordance with an embodiment of the invention.

Referring now to FIG. 2, there is shown a schematic diagram of a CMOS level shifter 200, in accordance with an embodiment of the invention. As compared to the conventional device 100 of FIG. 1, level shifter 200 introduces a diode-configured PFET T5 (which acts as a clamping device) to the design of FIG. 1. The gate terminal of T3 remains connected to the drain terminal of T4 as before. However, the gate of T4 is now coupled to the shorted gate/drain terminals of T5, as well as to both the drain of NFET T1 and the drain of PFET T3. The combination of PFET T5 and NFET T1 create a common source amplifier that amplifies the signal driving the gate of T4. The ratio of T1 to (T5+T3) needed to drive the gate of T4 is now smaller than that ratio of T1 to T3 in FIG. 1, thereby resulting in a reduced falling delay. When input A transitions from 1.0 V to 0 V, the gate of T4 rises to the higher transition voltage (e.g., 3.3 V) faster that with respect to the shifter 100 of FIG. 1, thus more quickly switching T4 off and allowing NFET T2 to pull the output to 0 V more quickly. This circuit is also not as dependent on the feedback connection from the Z output to the gate of T3 to turn off T4, which also helps improve the falling delay.

On the other hand, because of the diode-configured PFET T5, there is a small amount of DC current that flows through T5 and T1 when input A is at 1.0 V. In addition, the embodiment of FIG. 2 (while providing an improvement in falling delay) does not provide a similar rising delay improvement; i.e., when the value of A rises from 0 V to 1.0 V. This is because T3 is still fully on when the output node Z is initially at 0 V, thus T1 does not receive any extra assistance in pulling down the gate voltage of T4 to raise the output node Z.

Figure 3:
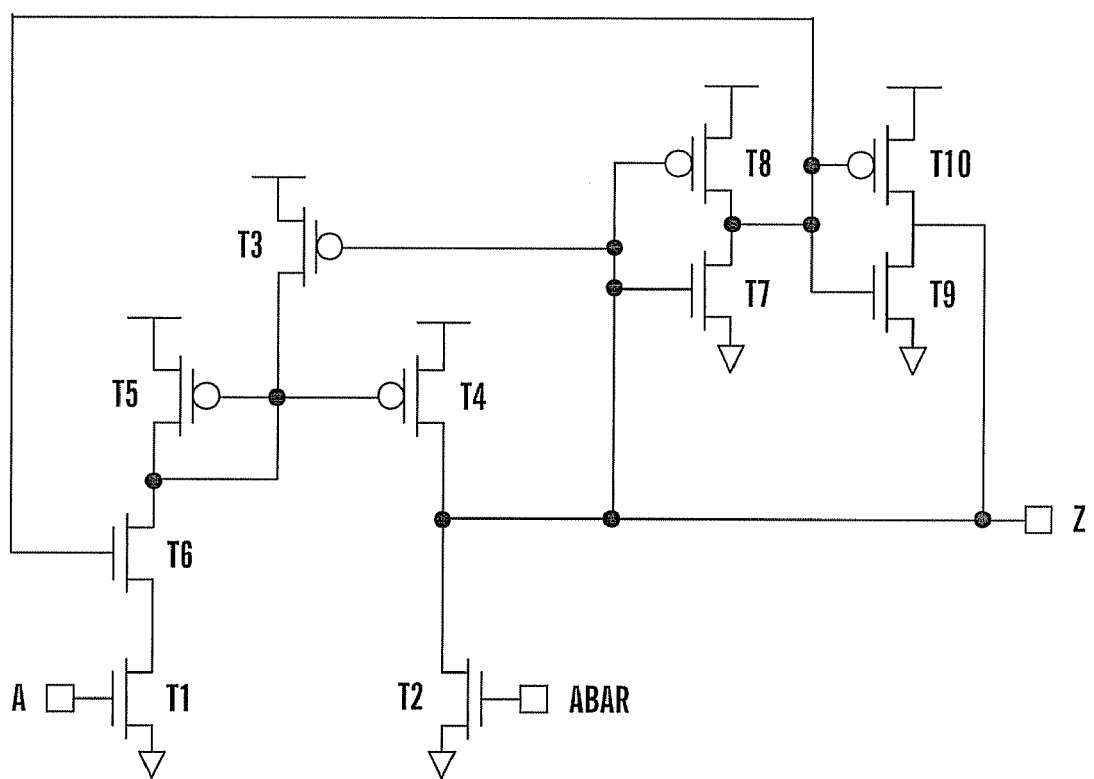
FIG. 3 is a schematic diagram of a CMOS level shifter, in accordance with another embodiment of the invention.

Accordingly, FIG. 3 is a schematic diagram of a CMOS level shifter 300, in accordance with an embodiment of the invention. As compared to the embodiment of FIG. 2, FIG. 3 further introduces NFETs T6, T7, T9 and PFETs T8, T1. More specifically, the source terminal of NFET T6 is connected to the drain of NFET T1 while the drain of T6 is connected to the drains of T3 and T5, as well as the gate of T4. The source terminals of PFETs T8 and T10 are connected to the higher voltage supply, while the source terminals of NFETs T7 and T9 are connected to ground. Furthermore, the gates of T8 and T7 are driven by the output Z. The drain terminals of T8 and T7 are connected to one another and drive the gates of T10 and T9. The drain terminals of T10 and T9 are connected together and drive the output Z.

Thus configured, devices T7, T8, T9, and T10 form a latch on the output Z and are all selected to be very small with respect to the other FET devices in the level shifter. A first inverter, defined by T7 and T8, drives the gate of NFET T6 and the input of a second inverter defined by T9 and T10. When the input A is initially at 0 V, the output node Z is at 0 V (as maintained by NFETs T2 and T9) and the gate of T6 is charged to 3.3 V (through conductive T8). Also, PFET T4 is off since the gate thereof is held at 3.3 V through conductive T3. Upon a rising transition, the series combination of T1 and T6 pulls the gate voltage of T4 down, thereby raising the output voltage on node Z toward 3.3 V. This in turn causes the output of the first inverter defined by T7 and T8 to transition from 3.3 V to 0 V, thereby causing the output of the second inverter defined by T9 and T10 to reinforce and latch the value of output node Z to 3.3 V. Because the output of T7 and T8 controls the gate of T6, T6 will be switched off, which then allows T5 to once again raise the voltage of the gate of T4 higher and making it weakly conductive or even turning it off altogether.

As T4 is not constantly maintained in a conductive state during a rising transition, the latch defined by T7, T8, T9 and T10 are therefore used to maintain the Z output at a high voltage level. Also, because T6 is off, there is no DC current path from PFET T5 to NFET T1 as in the case of the embodiment of FIG. 2. Conversely, during a falling transition, NFET T2 turns on to pull the output Z low. PFET T4 is switched off and thus NFET T2 need only overcome weak PFET T10. Once the voltage at node Z drops low enough, the gate of T6 is driven high by T8. This will allow T1 to operate correctly (i.e., activate T4) upon the next rising transition of A.

As indicated above, the latch devices T7, T8, T9 and T10 are kept to relatively minimum sizes. When the A input falls from logic 1 to logic 0, diode-configured T5 will have pulled the gate of T4 above its $V_t$ and turned T4 off. Thus, T2 need only overcome the relatively small sized PFET T10 in order to pull output node Z down to 0 v. As T10 is smaller than T4 in FIGS. 1 and 2, T2 of FIG. 1 may also be reduced in size, and the level shifter 300 will still operate correctly over all foreseeable PVT conditions. T2 is further aided by NFET T9 once the output voltage on node Z drops below the threshold of the latch and inverts its state.

Still another advantage of the embodiment of FIG. 3 is realized upon consideration of the fact that in the conventional device of FIG. 1 and the embodiment of FIG. 2, PFET T4 is turned on when A is logic 1. PFET T4 must be kept small enough for NFET T2 to overcome when A falls to 0

V. However, the circuit of FIG. 3 turns PFET T4 off when A is logic 1 so that the size of T4 does not effect the operation of NFET T2. This allows T4 to be increased greatly in size and thus greatly reduce the rising delay of the circuit.

Furthermore, the features of the circuit in FIG. 3 allow the input NFETs T1 and T2 to be reduced in size relative to the circuit of FIG. 2, while the size of T4 in FIG. 3 can be increased in size relative to the circuit of FIG. 2. The NFET to PFET ratio of T2 to T4 may be reduced to a more reasonable value of 4 to 1 or lower. All of these changes lead to a smaller circuit with improved rising and falling delays, as well as improved rise to fall delay mismatch characteristics, and a circuit that operates correctly over the extreme PVT variations required for a high yielding product.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A voltage level shifting device for translating a lower operating voltage to a higher operating voltage, comprising:
    a first input node coupled to a first pull down device and a second input node coupled to a second pull down device, wherein said second node receives a complementary logic signal with respect to said first input node, said first and second input nodes associated with the lower operating voltage;
    a first pull up device in series with said first pull down device and a second pull up device in series with said second pull down device, said first and second pull up devices coupled to a power supply at the higher operating voltage;
    an output node between said second pull down device and said second pull up device, said output node controlling the conductivity of said first pull up device
    a first inverter having an input connected to said output node;
    a second inverter having an input connected to an output of said first inverter, and an output of said second inverter connected to said output node;
    a switching device between said first pull up device and said first pull down device, said switching device controlled by said output of said first inverter; and
    a clamping device in parallel with said first pull up device, said clamping device configured to prevent said second pull up device from becoming fully saturated.

2. The voltage level shifting device of claim 1, wherein said clamping device comprises a diode configured transistor.

3. The voltage level shifting device of claim 1, wherein transistors of said first and second inverters are of weaker strength with respect to said pull up and pull down devices.

4. The voltage level shifting device of claim 1, wherein a size ratio of said second pull down device to said second pull up device is about 4:1 or less.

5. A CMOS level shifter for translating a lower operating voltage to a higher operating voltage, comprising:
    a first input node coupled to a first pull down NFET and a second input node coupled to a second pull down NFET, wherein said second node receives a complementary logic signal with respect to said first input node, said first and second input nodes associated with the lower operating voltage;
    a first pull up PFET in series with said first pull down NFET and a second pull up PFET in series with said second pull down NFET, said first and second pull up PFETs coupled to a power supply at the higher operating voltage;
    an output node between said second pull down NFET and said second pull up PFET, said output node controlling the conductivity of said first pull up PFET
    a first inverter having an input connected to said output node;
    a second inverter having an input connected to an output of said first inverter, and an output of said second inverter connected to said output node;
    an NFET between said first pull up device and said first pull down device, a gate terminal of said NFET connected to said output of said first inverter; and
    a clamping device in parallel with said first pull up PFET, said clamping device configured to prevent said second pull up PFET from becoming fully saturated.

6. The CMOS level shifter of claim 5, wherein a size ratio of said NFET to said PFET is about 4:1 or less.

7. The CMOS level shifter of claim 5, wherein said clamping device comprises a diode configured PFET.

8. The CMOS level shifter of claim 5, wherein transistors of said first and second inverters are of weaker strength with respect to said PFET and NFET devices.

* * * * *